(12) United States Patent
Kim et al.

(10) Patent No.: US 9,443,929 B2
(45) Date of Patent: Sep. 13, 2016

(54) SHALLOW TRENCH ISOLATION STRUCTURE HAVING A NITRIDE PLUG

(71) Applicant: International Business Machines Corporation, Armonk, NY (US)

(72) Inventors: Byeong Y. Kim, Lagrangeville, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/532,230

(22) Filed: Nov. 4, 2014

(65) Prior Publication Data

US 2015/0054080 A1    Feb. 26, 2015

Related U.S. Application Data

(62) Division of application No. 13/275,729, filed on Oct. 18, 2011, now Pat. No. 8,916,950.

(51) Int. Cl.
| | |
|---|---|
| *H01L 29/06* | (2006.01) |
| *H01L 27/088* | (2006.01) |
| *H01L 27/12* | (2006.01) |
| *H01L 21/84* | (2006.01) |
| *H01L 21/762* | (2006.01) |

(52) U.S. Cl.
CPC ..... *H01L 29/0649* (2013.01); *H01L 21/76283* (2013.01); *H01L 21/84* (2013.01); *H01L 27/088* (2013.01); *H01L 27/1203* (2013.01)

(58) Field of Classification Search
CPC .............. H01L 21/76224; H01L 21/823481; H01L 29/7846; H01L 21/76283
See application file for complete search history.

(56) References Cited

U.S. PATENT DOCUMENTS

| | | | |
|---|---|---|---|
| 5,712,185 A | 1/1998 | Tsai et al. | |
| 6,146,970 A | 11/2000 | Witek et al. | |
| 6,251,747 B1 | 6/2001 | Zheng et al. | |
| 6,323,104 B1 * | 11/2001 | Trivedi | H01L 21/76232 257/E21.507 |
| 6,518,145 B1 | 2/2003 | Alsmeier et al. | |
| 6,825,097 B2 | 11/2004 | Beyer et al. | |
| 6,995,447 B2 | 2/2006 | Lee et al. | |
| 7,622,344 B2 | 11/2009 | Liang et al. | |
| 7,713,887 B2 | 5/2010 | Eun | |
| 2001/0006839 A1 * | 7/2001 | Yeo | H01L 21/76229 438/435 |
| 2001/0041463 A1 | 11/2001 | Kakkad | |

(Continued)

OTHER PUBLICATIONS

IBM. IP.com. IPCOM000182028D, "A simple method to reduce STI recess for stress nitride fill at sub-32nm technology nodes", Apr. 22, 2009, 2 pages.

(Continued)

*Primary Examiner* — Ermias Woldegeorgis
*Assistant Examiner* — John Bodnar
(74) *Attorney, Agent, or Firm* — Jinesh P. Patel

(57) ABSTRACT

A semiconductor structure and method for forming a shallow trench isolation (STI) structure having one or more oxide layers and a nitride plug. Specifically, the structure and method involves forming one or more trenches in a substrate. The STI structure is formed having one or more oxide layers and a nitride plug, wherein the STI structure is formed on and adjacent to at least one of the one or more trenches. One or more gates are formed on the substrate and spaced at a distance from each other. A dielectric layer is formed on and adjacent to the substrate, the STI structure, and the one or more gates.

7 Claims, 8 Drawing Sheets

(56) References Cited

U.S. PATENT DOCUMENTS

| | | |
|---|---|---|
| 2002/0068415 A1 | 6/2002 | Tseng et al. |
| 2002/0177270 A1* | 11/2002 | Beyer ............... H01L 21/76224 438/221 |
| 2003/0181015 A1* | 9/2003 | Komatsu ............ H01L 21/2652 438/303 |
| 2004/0058549 A1 | 3/2004 | Ho et al. |
| 2004/0070023 A1* | 4/2004 | Kim ................... H01L 21/76224 257/315 |
| 2004/0126990 A1 | 7/2004 | Ohta |
| 2004/0266133 A1 | 12/2004 | Kim |
| 2005/0151222 A1 | 7/2005 | Xiang et al. |
| 2008/0203523 A1 | 8/2008 | Anderson et al. |
| 2008/0268589 A1* | 10/2008 | Farber et al. ................. 438/218 |
| 2009/0020845 A1 | 1/2009 | Shin et al. |
| 2009/0170280 A1 | 7/2009 | Park |

OTHER PUBLICATIONS

Cai et al, "Shallow Trench Isolation Recess Repair Using Spacer Formation Process", U.S. Appl. No. 12/914,095, filed Oct. 28, 2010, 18 pages.

Kim et al., "Shallow Trench Isolation Structure Having a Nitride Plug", U.S. Appl. No. 13/275,729, filed Oct. 18, 2011, 30 pages.

Wolf et al., "Silicon Processing for the VLSI Era", vol. 1, Second Edition, Lattice Press, 2000, p. 796.

Nag et al., "Comparative Evaluation of Gap-Fill Dielectrics in Shallow Trench Isolation for Sub-0.25 ym Technologies", Texas Instruments Inc., Dallas, TX, Dig. IEDM, 1996, pp. 32.6.1-32.6.4.

* cited by examiner

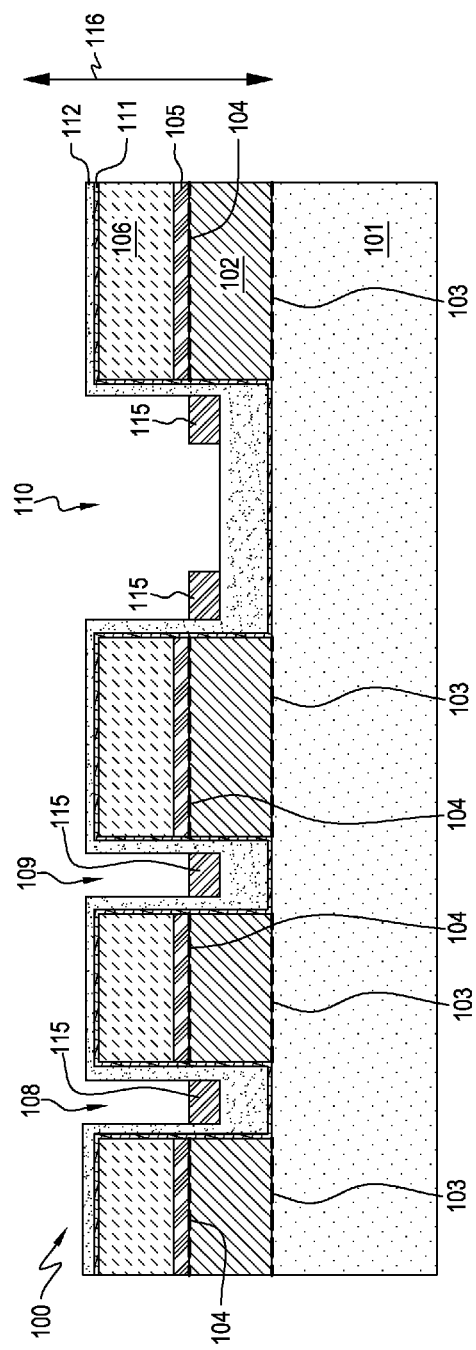
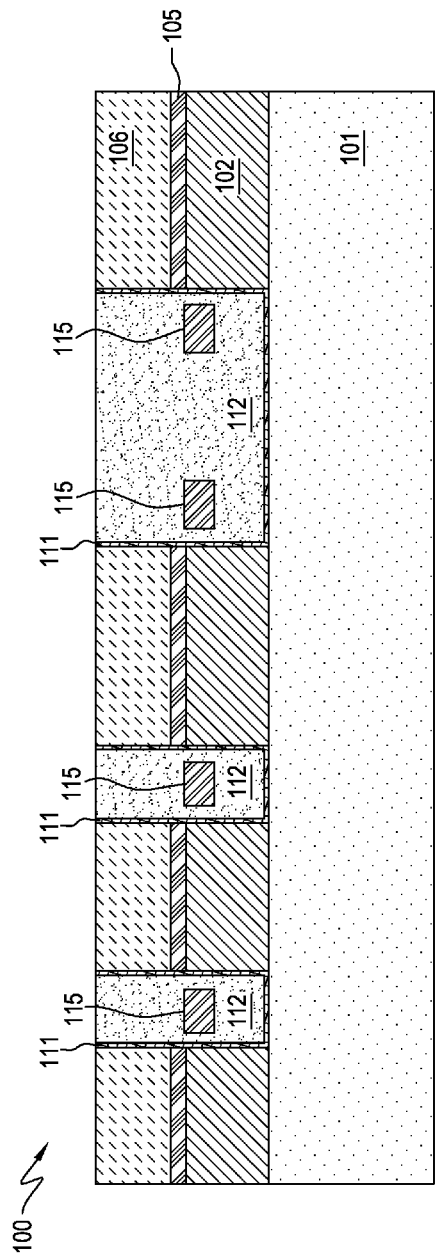

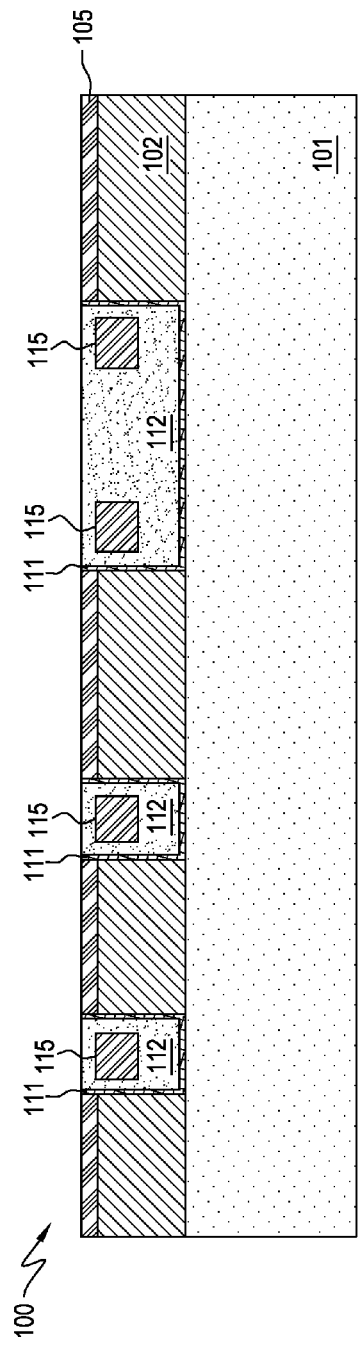
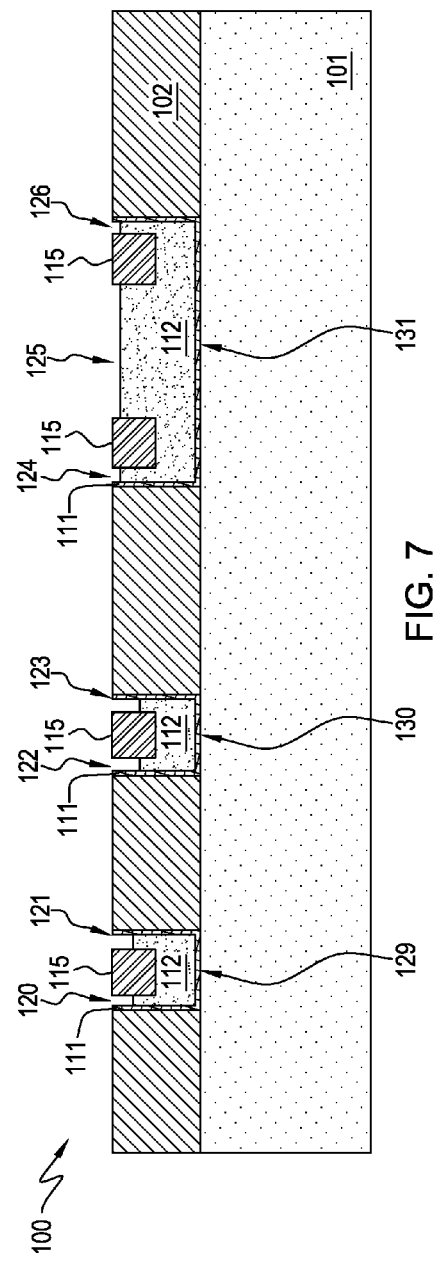

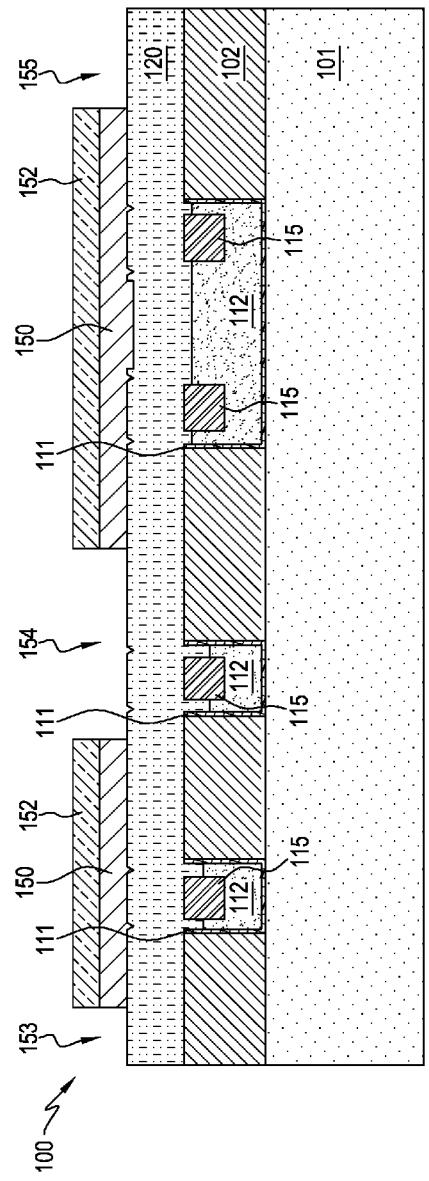
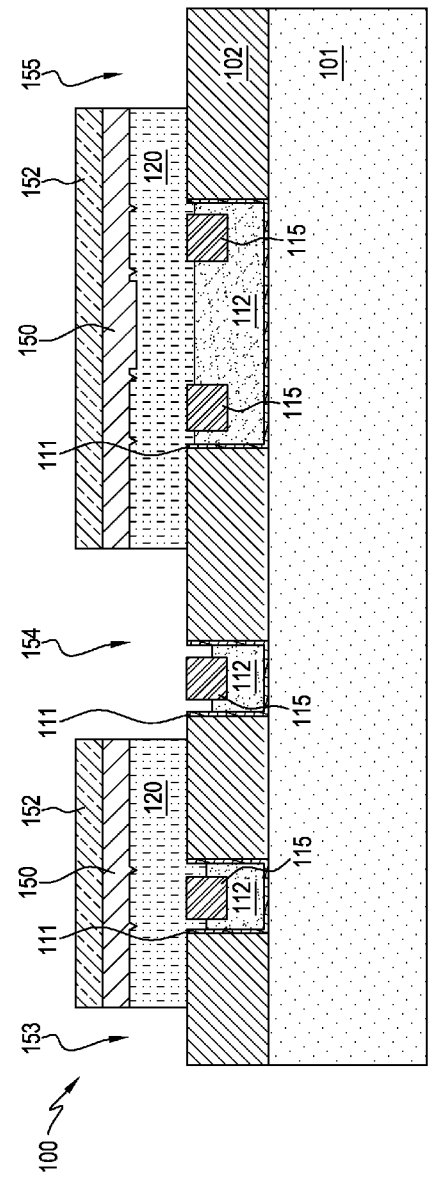

SHALLOW TRENCH ISOLATION STRUCTURE HAVING A NITRIDE PLUG

CROSS REFERENCE TO RELATED APPLICATION

This application is a Divisional Application of U.S. patent application Ser. No. 13/275,729 filed Oct. 18, 2011.

TECHNICAL FIELD

The present invention relates to the fabrication of semiconductor integrated circuit (IC) structures, and more particularly to formation of a STI structure having one or more oxide layers and a nitride plug.

BACKGROUND

Shallow trench isolation (STI) structures are formed in a substrate to electrically isolate regions of adjacent semiconductor devices that are formed in the substrate. Each STI structure includes oxide (STI oxide), and each STI structure has a corresponding STI step height. The step height of a STI structure is the distance, in a vertical dimension, from a lateral surface of the STI structure to a lateral surface of a gate stack. Specifically, the lateral surface of the gate stack that is of interest, when determining the step height of the STI structure, is the lateral surface of the gate stack that is directly on the substrate. Moreover, the lateral surface of the STI structure that is of interest, when determining the step height of the STI structure, is the lateral surface of the STI structure that is closest in distance, in the vertical dimension, to the lateral surface of the gate stack. The lateral surface of the gate stack is parallel to the lateral surface of the STI structure. In addition, the STI step height corresponding to each STI structure depends on the amount of STI oxide loss caused by a pre-gate oxidation cleaning process, wherein the pre-gate oxidation cleaning process includes performing one or more hydrofluoric (HF) wet etch steps that can remove an amount of STI oxide. Each STI structure may have different doping profiles that can cause the STI oxide of more than one STI structure to be etched at different rates. Moreover, having more than one STI structure etched at different rates can cause STI step height to vary thereby resulting in systematic STI step height variation that adds to general process variation when fabricating semiconductor integrated circuits (ICs). The STI step height variation and general process variation can reduce yield rates of a semiconductor fabrication system for creating ICs with STI structures.

Yield rate refers to the percentage of usable ICs produced by the semiconductor fabrication system compared to the total number of usable ICs attempted by the semiconductor fabrication system. Also, yield rate may refer to the percentage of usable ICs obtained on average from a semiconductor wafer that is processed through the semiconductor fabrication system. Low yield rates may be caused by defects from foreign material, semiconductor structures formed with a lack of process margin, and/or lack of process variation control by the semiconductor fabrication system that creates the ICs.

A common defect is a precursor defect that can cause formation of voids in a dielectric layer of the ICs. The formation of voids in the dielectric layer can occur by having higher gap fill aspect ratios than a semiconductor fabrication system process is capable of handling, wherein the dielectric layer is formed on an STI structure of the ICs. Moreover, the formation of voids and the size of the voids in the dielectric layer can increase due to variation in STI step height. In addition, during subsequent processing after forming of the dielectric layer the voids may become exposed by chemical-mechanical planarization (CMP) and filled with conductive material creating a conductive stringer. The conductive stringer is a defect that may become a region of abnormally low electrical impedance, which can result in a short circuit and decrease yield rate. Thus, variation in STI step height can cause defects in the ICs, such as void formation and conductive stringers that present difficulties in achieving high yield rates for the semiconductor fabrication system.

SUMMARY

The present invention relates to a structure and method for forming a shallow trench isolation structure having one or more oxide layers and a nitride plug, wherein the STI structure is formed on and adjacent to at least one of one or more trenches to minimize STI step height variation. Minimizing STI step height variation can reduce high gap fill ratios and the formation of voids and conductive stringers in a dielectric layer formed on and adjacent to the STI structure, and improve yield rates for a semiconductor fabrication system.

A first aspect of the present invention provides a semiconductor device that includes a substrate. One or more trenches are formed in the substrate. A shallow trench isolation structure is formed having one or more oxide layers and a nitride plug, wherein the shallow trench isolation structure is formed on and adjacent to at least one of the one or more trenches. One or more gates are formed on the substrate and spaced at a distance from each other. A dielectric layer is formed on and adjacent to the substrate, the shallow trench isolation structure, and the one or more gates.

A second aspect of the present invention provides a method for forming a semiconductor device. The method begins with forming a pad oxide layer on a substrate. A pad nitride layer is formed on the pad oxide layer. One or more trenches are formed through the pad nitride layer, the pad oxide layer, and into the substrate. A liner oxide layer is formed on the pad nitride layer, and on and adjacent to the one or more trenches. A first layer of high density plasma (HDP) oxide is formed on and adjacent to the liner oxide layer. A nitride layer is formed on and adjacent to the HDP oxide in at least one of the one or more trenches. A portion of the nitride layer is removed, which forms a nitride plug that remains on and adjacent to the HDP oxide in the at least one of the one or more trenches. A second layer of the HDP oxide is formed on the nitride plug, wherein the nitride plug is encapsulated in the HDP oxide. A portion of the HDP oxide and a portion of the liner oxide layer are planarized, wherein the HDP oxide, the liner oxide layer, and the nitride plug remain in the at least one of the one or more trenches. The pad nitride layer, the pad oxide layer, a portion of the liner oxide layer, and a portion of the HDP oxide are removed in which a shallow trench isolation structure is formed in the at least one of the one or more trenches. One or more gates are formed on the substrate, wherein the one or more gates are spaced at a distance from each other. A dielectric layer is formed on and adjacent to the substrate, the one or more gates, and the shallow trench isolation structure.

A third aspect of the present invention provides a method for forming a semiconductor device. The method begins with forming a substrate. One or more trenches are formed in the substrate. A shallow trench isolation structure having one or more oxide layers and a nitride plug are formed, wherein the shallow trench isolation structure is on and adjacent to at least one of the one or more trenches. One or more gates are formed on the substrate and spaced at a distance from each other. A dielectric layer is formed on and adjacent to the substrate, the shallow trench isolation structure, and the one or more gates.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

FIGS. 1-13 are cross-sectional views of semiconductor structures that illustrate various stages during fabrication of shallow trench isolation structures having at least one nitride plug according to one embodiment of the present invention.

Figure 1:
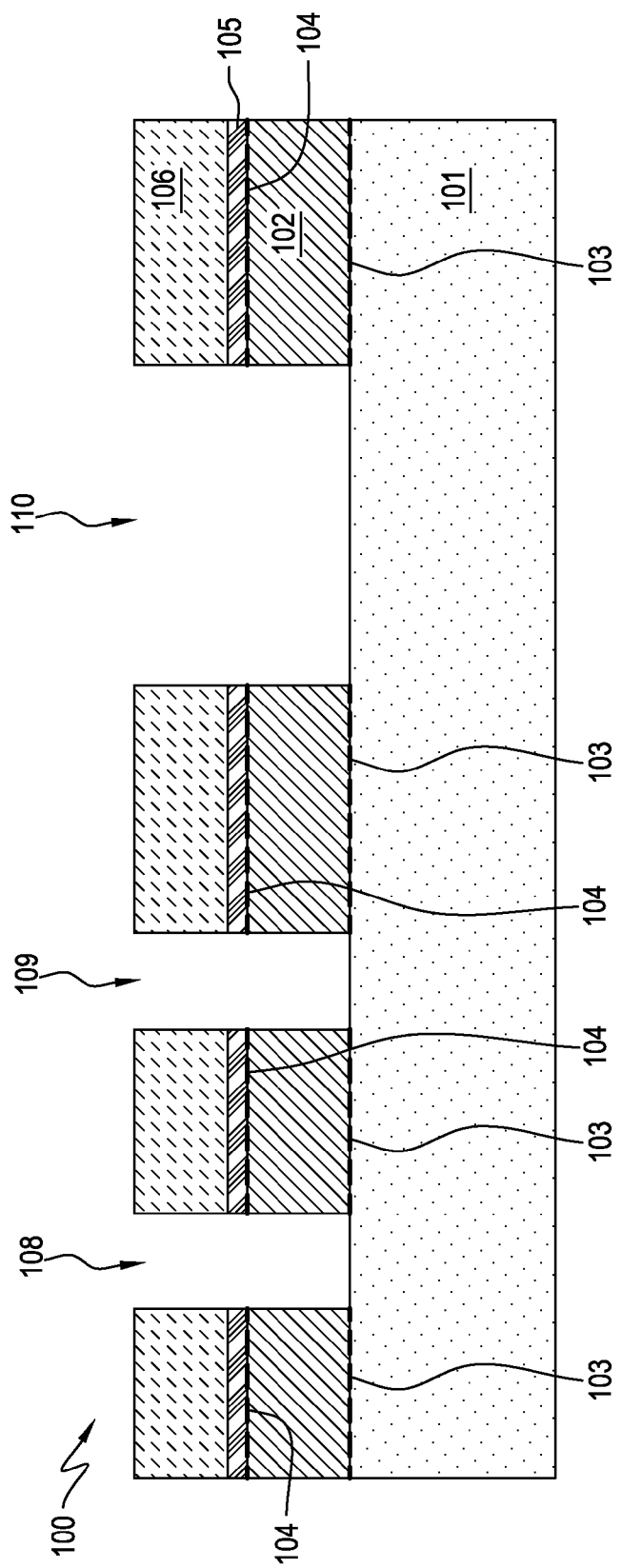

The drawings are not necessarily to scale. The drawings, which are merely pictorial cross-sectional views, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Moreover, although the embodiments depicted herein are shown in two dimensional views with various regions having width and depth, it should be clearly understood that these regions are illustrations of only a portion of a single unit of a device, which may include a plurality of such units arranged in a three-dimensional structures.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, dielectric, or substrate is referred to as being "on" or "over", "disposed on", "disposed over", "deposited on", or "deposited over" another element, it can be directly on the other element or intervening elements may also be present. In contrast, when an element is referred to as being "directly on", "directly over", or "disposed proximately to" another element, there are no intervening elements present. Furthermore, it will be understood that when an element as a layer, region, dielectric, or substrate is referred to as being "adjacent to" or "disposed adjacent to" another element, it can be directly adjacent to the other element or intervening elements may be present. In contrast, when an element is referred to as being "directly adjacent to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. Lastly, it will also be understood that when an element as a layer, region, dielectric, or substrate is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

Embodiments of the present invention provide a STI structure having one or more oxide layers and a nitride plug for improved STI step height control (i.e., for minimizing STI step height variation). Improving STI step height control can reduce high gap fill ratios, void formation, and conductive stringers. In addition, improving STI step height control can result in increased yield rates of semiconductor fabrication systems that create integrated circuits (ICs) having STI structures.

FIG. 1 illustrates a cross-sectional view of semiconductor 100 at a stage in the fabrication process, wherein semiconductor 100 is fabricated utilizing silicon-on-insulator technology. Thus, semiconductor 100 includes buried oxide layer 101, substrate 102, pad oxide layer 105, and pad nitride layer 106. Specifically, substrate 102 having first lateral surface 103 and second lateral surface 104 is formed on buried oxide layer 101. Pad oxide layer 105 is formed on substrate 102. Pad nitride layer 106 is formed on pad oxide layer 105. Trenches 108-110 are formed through pad nitride layer 106, pad oxide layer 105, and substrate 102 utilizing photolithography and anisotropic reactive ion etching (RIE) selective to buried oxide layer 101. However, other conventional etching/removal techniques such as isotropic RIE, wet etching, plasma etching, or ion milling may be utilized to form trenches 108-110. Moreover, other variations of lithography, for example a tri-layer and hardmask process, can be utilized for improved control of critical semiconductor structure dimensions, or etch profile and depth control. Trenches 108 and 109 have a high aspect ratio with respect to a minimum ground rule dimension associated with trenches 108 and 109, but trench 110 has a low aspect ratio with respect to a relaxed minimum ground rule dimension associated with trench 110.

Furthermore, buried oxide layer 101 includes an oxide that can be thermally grown at a temperature ranging from about 900° C. to 1000° C. Substrate 102 may be bulk silicon. Pad oxide layer 105 includes an oxide, for example silicon dioxide thermally grown, at a temperature ranging from about 850° C. to 950° C., on substrate 102. Pad nitride layer 106 is formed utilizing low pressure chemical vapor deposition (LPCVD) at a temperature ranging from about 750° C. to 850° C., and at a pressure ranging from about 250 mTorr to 350 mTorr. In an alternative embodiment (not shown), semiconductor 100 may be fabricated without silicon-on-insulator technology, wherein buried oxide layer 101 is not present. However, even if silicon-on-insulator technology is not utilized subsequent formation of STI structures still remains the same.

Figure 2:
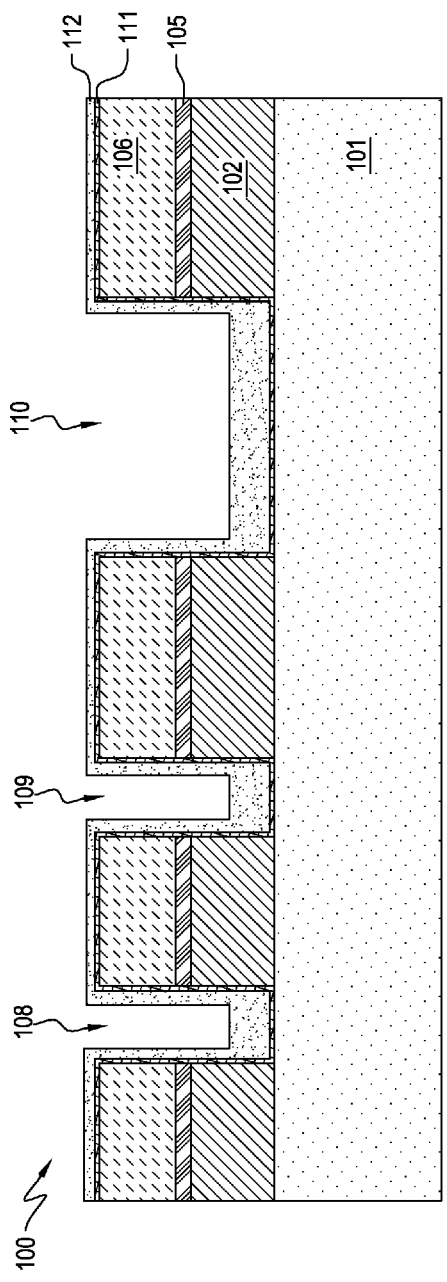

FIG. 2 illustrates a cross-sectional view of semiconductor 100 at a stage of fabrication, wherein liner oxide layer 111 having a thickness of about 2 nm to 5 nm is formed on and adjacent to pad nitride layer 106 and on and adjacent to trenches 108-110 utilizing thermal oxidation of silicon at a temperature ranging from about 700° C. to 900° C. Nitrogen can be incorporated into liner oxide layer 111 under a nitrogen-containing ambient ($NH_3$) atmosphere at a temperature ranging from about 700° C. to 800° C. In an alternative embodiment (not shown), it is possible to add a thin chemical vapor deposition (CVD) nitride film on liner oxide layer 111 to protect substrate 102 from subsequent high density plasma CVD damage. Thus, at a fabrication stage subsequent to the formation of liner oxide layer 111, a layer of high density plasma (HDP) oxide 112 is formed on and adjacent to liner oxide layer 111 utilizing high density plasma CVD at a temperature ranging from about 500° C. to 600° C. In a preferred embodiment, the layer of HDP oxide 112 may be silicon dioxide. The thickness of the layer of HDP oxide 112 in trenches 108-110, at this stage of fabrication, ranges from about 20 nm to 40 nm depending on the aspect ratio of trenches 108-110.

Figure 3:
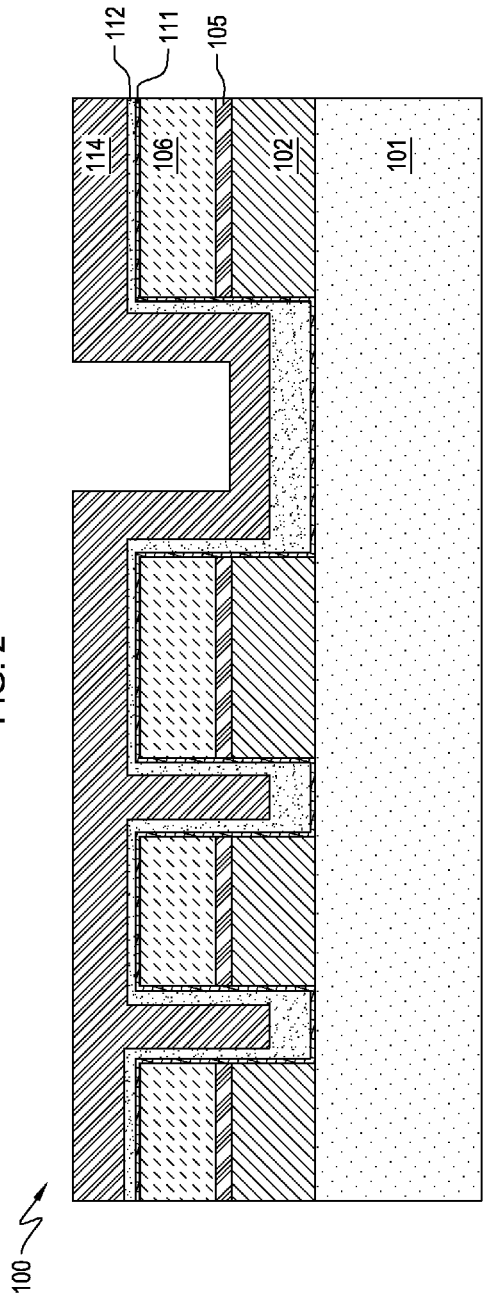

FIG. 3 is a cross-sectional view of semiconductor 100 at a subsequent stage of fabrication, wherein nitride layer 114 is formed on and adjacent to the layer of HDP oxide 112 within trenches 108-110 utilizing LPCVD at a temperature ranging from about 750° C. to 850° C. Nitride layer 114 can be a stoichiometric $Si_3N_4$ film, a stress engineered film with a different silicon (Si) and nitrogen (N) ratio, or other type of insulator that is resistant to hydrofluoric (HF) solution. Specifically, trenches 108 and 109 are completely filled with nitride layer 114, because trenches 108 and 109 have a high aspect ratio. However, nitride layer 114 does not completely fill trench 110, because trench 110 has a low aspect ratio. Moreover, nitride layer 114 can have a thickness of up to about one-third the height of respective trenches 108-110, and the thickness can be adjusted based on ground rules associated with trenches 108-110.

FIG. 4 illustrates an end result of a RIE process performed on semiconductor 100. The RIE process is anisotropic and removes a portion of nitride layer 114 to form at least one nitride plug 115 in each of trenches 108-110, wherein the nitride plug can be a stoichiometric $Si_3N_4$ film, a stress engineered film with a different Si and N ratio, or other type of insulator that is resistant to HF solution. The portion of nitride layer 114 is removed in a manner such that the distance, in vertical dimension 116, of a point on nitride plug 115 furthest away from the first lateral surface 103 is about equal to but does not exceed the distance, in vertical dimension 116, of a point on the second lateral surface 104 furthest away from the first lateral surface 103. As a result of the RIE process, trenches 108-110 are not completely filled. Thus, the RIE process, which removes the portion of nitride layer 114, is tunable to form a nitride plug of a specified size. Moreover, the RIE condition can be a carbon fluoride (CF) containing plasma with $CHF_3$ and/or carbon tetrafluoride ($CF_4$).

FIG. 5 illustrates an end result after filling the remaining portions of trenches 108-110 with an additional layer of HDP oxide 112, and performing a chemical-mechanical planarization (CMP) process on semiconductor 100 selective to pad nitride layer 106. The additional layer of HDP oxide 112 is formed directly on nitride plug 115 utilizing high density plasma CVD at a temperature ranging from about 500° C. to 600° C. As a result, HDP oxide 112 remains in trenches 108-110, and each nitride plug 115 is encapsulated in HDP oxide 112 within their respective trenches 108-110.

FIG. 6 illustrates a successive stage of fabrication, wherein a first HF wet etch is performed that removes a portion of HDP oxide 112. However, an amount of HDP oxide 112 remains in trenches 108-110 to protect each nitride plug from a subsequent orthophosphoric acid ($H_3PO_4$) wet etch step, wherein the $H_3PO_4$ wet etch step removes pad nitride layer 106 selective to pad oxide layer 105 and HDP oxide 112. As a result, each nitride plug 115 in trenches 108-110 is not removed by any wet etch step that is performed.

FIG. 7 illustrates the formation of divots 120-126 in corresponding trenches 108-110 as a result of a pre-gate oxidation cleaning process. Each nitride plug 115 remains intact and is not removed, because the pre-gate oxidation cleaning process is highly selective to each nitride plug 115. Specifically, the pre-gate oxidation cleaning process may include multiple HF wet etch process steps as well as ion implantation, wherein a portion of HDP oxide 112 is etched to form divots 120-126. However, the pre-gate oxidation cleaning process does not attack any nitride plug 115. Thus, even after the pre-gate oxidation cleaning process STI step height variation is minimized, and STI structures 129-131 remain in trenches 108-110, respectively. STI structures 129-131 each include a nitride plug 115, liner oxide layer 111, and HDP oxide 112.

Figure 8:
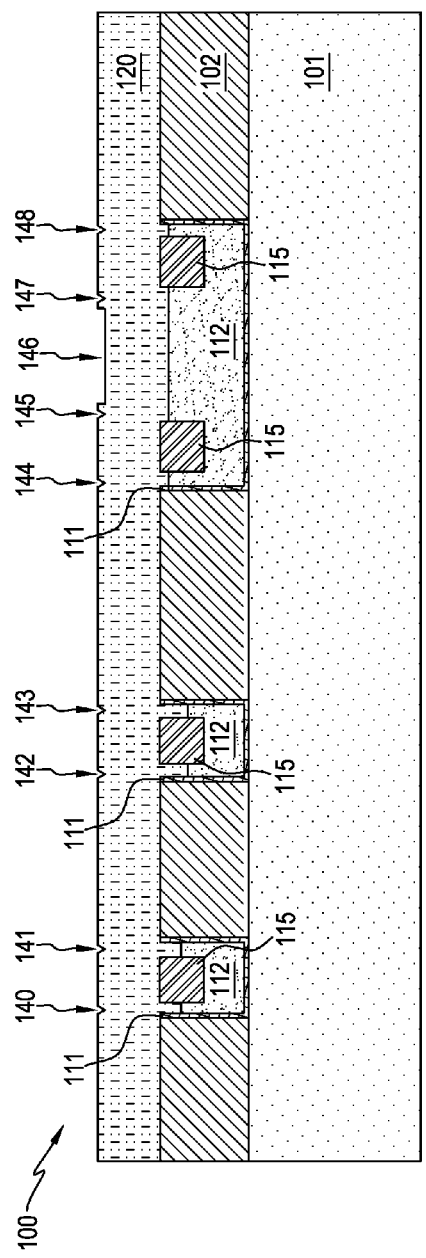

FIG. 8 illustrates the formation of a poly-silicon and/or metal layer 120 on substrate layer 102, on and adjacent to liner oxide layer 111, on HDP oxide 112, and on and adjacent to each nitride plug 115. Poly-silicon and/or metal layer 120 is deposited utilizing LPCVD at a temperature ranging from about 600° C. to 625° C., and at a pressure ranging from about 150 mTorr to 250 mTorr. Although not shown for simplicity, a gate dielectric layer is deposited on substrate 102 utilizing a CVD process or any other conventional deposition technique in which the dielectric layer is an oxide that may include, but is not limited to, silicon dioxide, hafnium oxide, or zirconium oxide. Thus, poly-silicon and/or metal layer 120 is formed directly on the dielectric layer (not shown). The topography of poly-silicon and/or metal layer 120 is almost level (i.e., almost flat and even), wherein only relatively small regions of unevenness 140-148 appear along poly-silicon and/or metal layer 120. Specifically, the presence of nitride plugs 115 contribute to poly-silicon and/or metal layer 120 having a topography that is almost level, and is conformal to divots 120-126.

Figure 9:
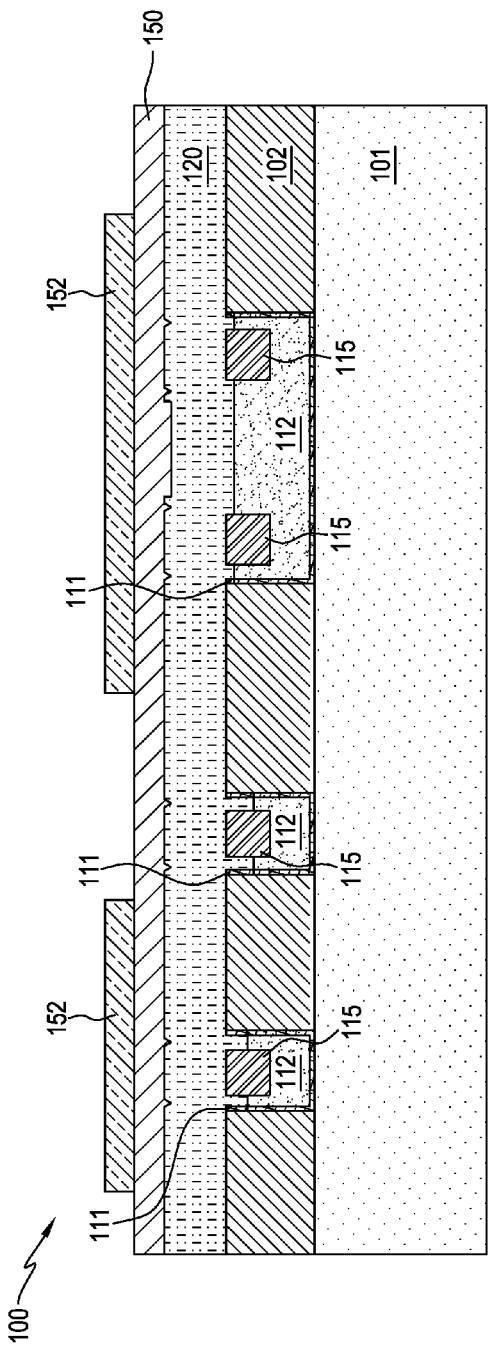

FIG. 9 illustrates the formation of hardmask 150 and photoresist 152 on poly-silicon and/or metal layer 120. Specifically, hardmask 150 is deposited on poly-silicon and/or metal layer 120, and photoresist 152 is patterned directly on regions of hardmask 150. The thickness of hardmask 150 ranges from about 50 nm to 150 nm. Typically, hardmask 150 is an insulator, for example, an oxide or a nitride deposited utilizing LPCVD or a combination of oxide and nitride. In one embodiment, if hardmask 150 is an oxide then hardmask 150 can be deposited by LPCVD at a temperature ranging from about 500° C. to 700° C. utilizing tetraethyl orthosilicate (TEOS). In an alternative embodiment, if hardmask 150 is a nitride then hardmask 150 can be deposited by LPCVD at a temperature ranging from about 700° C. to 800° C., and at a pressure ranging from about 10 mTorr to 300 mTorr in which a gas mixture of ammonia ($NH_3$) and dichlorosilane ($SiH_2Cl_2$) may be utilized. In still another alternative embodiment, if hardmask 150 may be a nitride then hardmask 150 can be deposited by plasma CVD at a temperature ranging from about 300° C. to 600° C. in which a gas mixture of ammonia ($NH_3$) and dichlorosilane ($SiH_2Cl_2$) or silane ($SiH_4$) may be utilized.

FIG. 10 illustrates the formation of openings 153-155 in hardmask 150, wherein portions of hardmask 150 are removed utilizing a RIE process selective to poly-silicon and/or metal layer 120. Specifically, the RIE process is anisotropic and is performed utilizing gases that include carbon and fluorine, for example, $CF_4$ or difluoromethane ($CH_2F_2$). Alternatively, plasma etching may be utilized to form openings 153-155 in hardmask 150. In addition, each nitride plug 115 also contributes to the integrity of the anisotropic RIE process that removes portions of hardmask 150, because poly-silicon and/or metal layer 120 has a topography that is almost level. Poly-silicon and/or metal layer 120 having a topography that is almost level allows hardmask 150 to have a uniform thickness.

FIG. 11 illustrates a successive stage of fabrication, wherein portions of poly-silicon and/or metal layer 120 within openings 153-155 are removed utilizing an anisotropic RIE process. The anisotropic RIE process is performed utilizing hydrogen bromide (HBr) and oxygen gas at a pressure ranging from 1 mTorr to 100 mTorr. Moreover, the anisotropic RIE of portions of poly-silicon and/or metal layer 120 within openings 153-155 is selective to any region of substrate 102, liner oxide layer 111, nitride plug 115, and/or HDP oxide 112 that are exposed at openings 153-155. Furthermore, each nitride plug 115 also minimizes residue from poly-silicon and/or metal layer 120 from remaining after the anisotropic RIE is performed.

Figure 12:
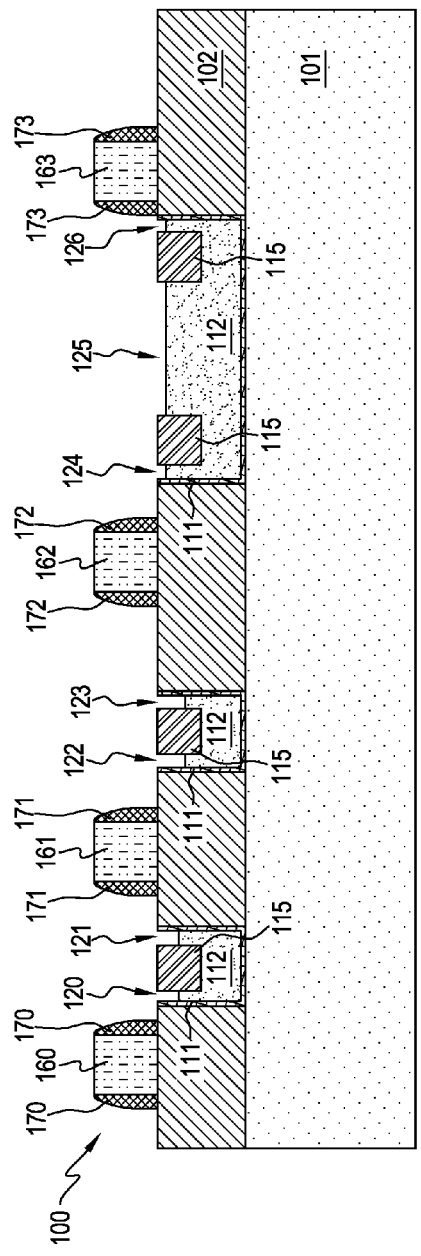

FIG. 12 illustrates semiconductor 100 after gates 160-163 with corresponding spacers 170-173 are formed on substrate 102 in which during the formation of gates 160-163, HDP oxide 112 may be etched resulting in an increase in height of divots 120-126. However, even if HDP oxide 112 is etched, enough HDP oxide 112 remains such that each nitride plug 115 is still embedded in HDP oxide 112 within respective trenches 108-110. Depending on the thickness and amount of over-etching of spacers 170-173 a portion of dielectric material from spacers 170-173 may enter and remain in divots 120-124 and 126 (i.e., divots that are directly adjacent to gates 160-163). The material utilized to form spacers 170-173 may include nitride, oxide, or any other dielectric material.

Figure 13:
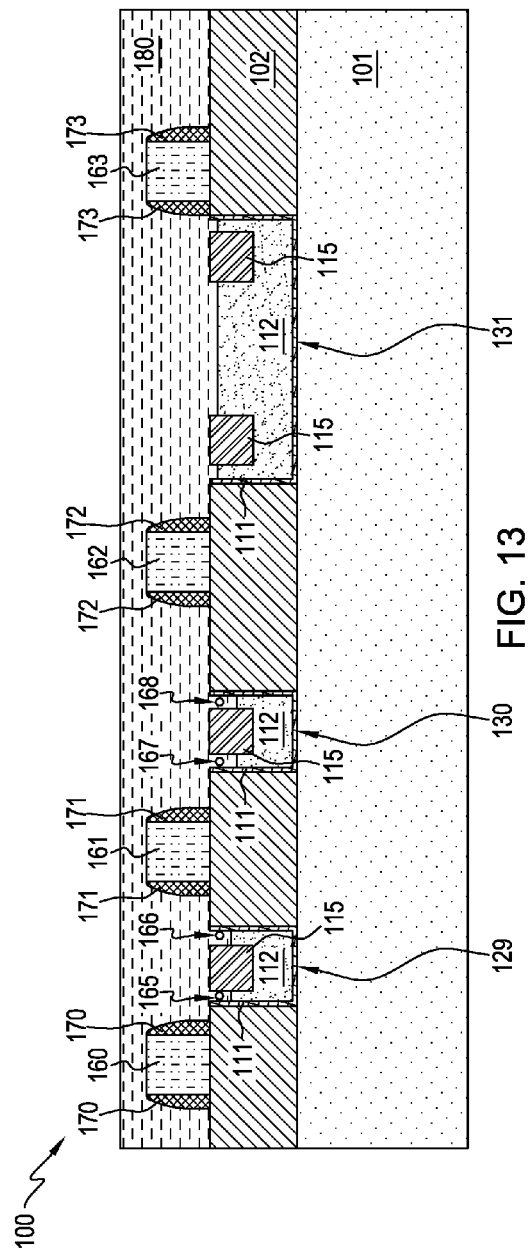
Figure 14:
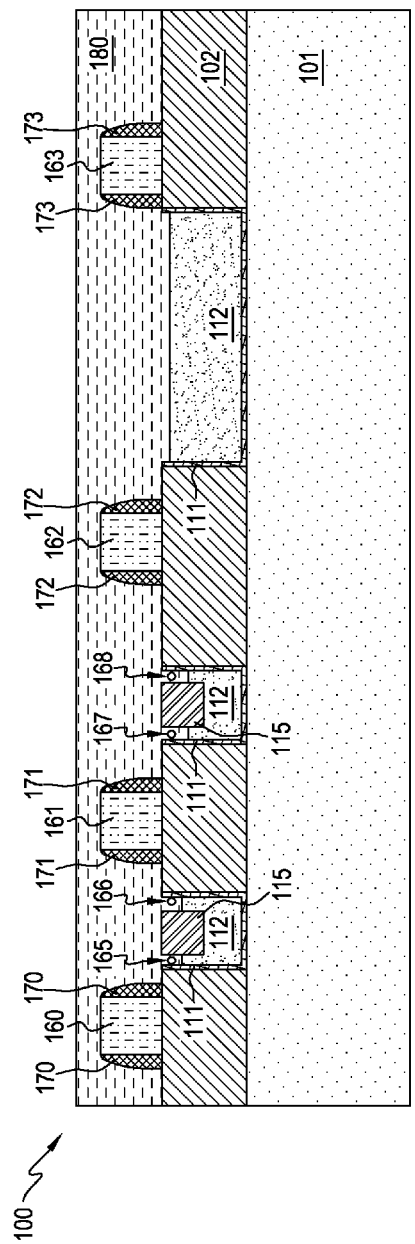
FIG. 14 is a cross-sectional view of an alternative embodiment of semiconductor structures at a stage during fabrication, wherein one or more shallow trench isolation structures are formed having a nitride plug, and wherein at least one shallow trench isolation structure does not have a nitride plug according to one embodiment of the present invention.
Figure 15:
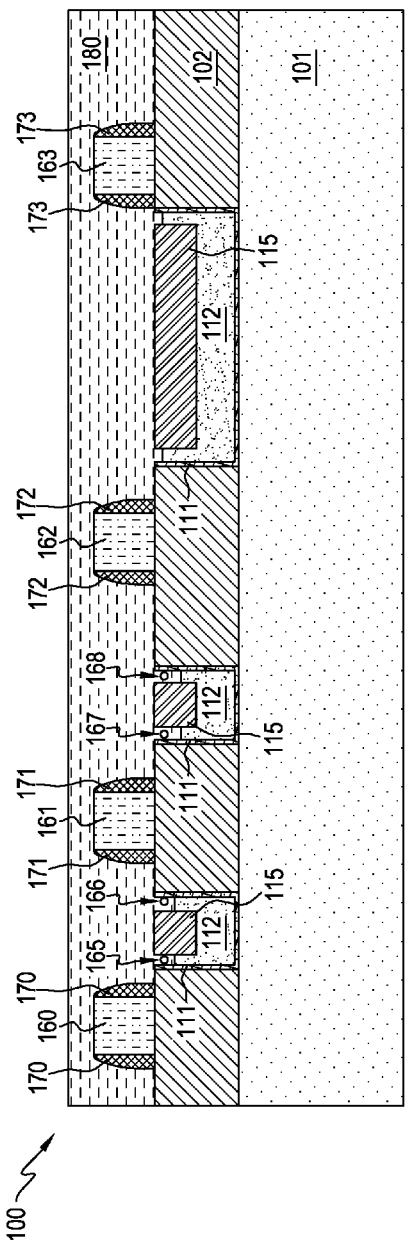
FIG. 15 is a cross-sectional view of an alternative embodiment of semiconductor structures at a stage during fabrication, wherein one or more shallow trench isolation structures are formed having a nitride plug of different sizes according to one embodiment of the present invention.

FIG. 13 illustrates semiconductor 100 after a CMP of dielectric layer 180 in which dielectric layer 180 is formed on substrate 102, on gates 160-163, on HDP oxide 112, on and adjacent to liner oxide layer 111, and on and adjacent to nitride plug 115. Voids 165-168 may form in dielectric layer 180, specifically in regions having a high aspect ratio such as in divots 120-123. However, each nitride plug 115 of STI structure 129 and 130 minimizes the size of voids 165-168 formed in dielectric layer 180. Minimizing the size of the voids and confining the voids to a region that is closer to STI structures 129-131 is important, because the dielectric layer 180 may be etched during subsequent processing causing the voids to be exposed, wherein conductive material can enter the voids and form conductive stringers. Conductive stringers are undesirable, because they are defects that can result in short circuits and decrease yield rates. In the present embodiment, semiconductor 100 is fabricated having at least one nitride plug 115 of a same specified size between adjacent gates 160 and 161, 161 and 162, and 162 and 163. However, in an alternative embodiment, as illustrated in FIG. 14, semiconductor 100 may be fabricated without nitride plug 115 between all adjacent gates 160-163, for example between gates 162 and 163. In another alternative embodiment shown in FIG. 15, each nitride plug 115 may have a different specified size, wherein semiconductor 100 is fabricated having a wide nitride plug 115 between adjacent gates 162 and 163 in comparison to a narrow nitride plug 115 between gates 160 and 161, and between gates 161 and 162.

Furthermore, those skilled in the art will note from the above description, that presented herein is a novel STI structure and method for forming the STI structure having one or more oxide layers and a nitride plug, wherein the STI structure is formed on and adjacent to at least one of one or more trenches to minimize STI step height variation. Minimizing STI step height variation can reduce high gap fill ratios, and the formation of voids and conductive stringers in a dielectric layer formed on and adjacent to the STI structure, and improve yield rates for a semiconductor fabrication system. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A semiconductor device comprising:
   a substrate;
   one or more trenches in the substrate;
   a shallow trench isolation structure having one or more oxide layers and at least two nitride plugs, wherein the at least two nitride plugs are within the one or more trenches, and wherein the one or more oxide layers includes a high density plasma oxide (HDP), and the at least two nitride plugs are encapsulated in the high density plasma (HDP) oxide;
   one or more gates formed on the substrate and spaced at a distance from each other; and
   a dielectric layer formed on and adjacent to the substrate, the shallow trench isolation structure, and the one or more gates.

2. The semiconductor device of claim 1, wherein the substrate comprises bulk silicon or silicon-on-insulator.

3. The semiconductor device of claim 1, wherein the one or more oxide layers of the shallow trench isolation structure further comprises a liner oxide layer.

4. The semiconductor device of claim 3, wherein the liner oxide layer is an oxide that comprises silicon oxynitride that is formed on and adjacent to the one or more trenches.

5. The semiconductor device of claim 1, wherein the high density plasma (HDP) oxide is an oxide that comprises silicon dioxide that is formed on and adjacent to the liner oxide layer utilizing plasma CVD at a temperature ranging from about 500° C. to 600° C.

6. The semiconductor device of claim 1, wherein:
the at least two nitride plugs comprises a stoichiometric $Si_3N_4$ film, a stress engineered film with a different silicon (Si) and nitrogen (N) ratio, or other type of insulator that is resistant to hydrofluoric (HF) solution; and
the at least two nitride plugs are formed utilizing CVD at a temperature ranging from about 750° C. to 850° C.

7. The semiconductor device of claim 1, wherein the at least two nitride plugs are of a same size.

* * * * *